United States Patent
Min et al.

(10) Patent No.: US 12,262,467 B2
(45) Date of Patent: Mar. 25, 2025

(54) PRINTED CIRCUIT BOARD INCLUDING AN INSULATING LAYER AND A METAL POST

(71) Applicant: SAMSUNG ELECTRO-MECHANICS CO., LTD., Suwon-si (KR)

(72) Inventors: Tae Hong Min, Suwon-si (KR); Eun Su Kwon, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 180 days.

(21) Appl. No.: 18/113,834

(22) Filed: Feb. 24, 2023

(65) Prior Publication Data
US 2024/0057251 A1 Feb. 15, 2024

(30) Foreign Application Priority Data
Aug. 10, 2022 (KR) .......... 10-2022-0099856

(51) Int. Cl.
*H05K 1/02* (2006.01)

(52) U.S. Cl.
CPC . *H05K 1/0296* (2013.01); *H05K 2201/10227* (2013.01); *H05K 2201/10984* (2013.01)

(58) Field of Classification Search
CPC ........ H05K 1/0296; H05K 1/09; H05K 1/181; H05K 3/4007; H05K 1/02; H05K 3/282; H05K 3/3452; H05K 2201/10227; H05K 2201/10984

USPC ......................................................... 174/251
See application file for complete search history.

(56) References Cited

U.S. PATENT DOCUMENTS

| | | | |
|---|---|---|---|
| 2013/0161085 A1* | 6/2013 | Oh .................... | H01L 23/49811 174/267 |
| 2015/0144384 A1 | 5/2015 | Ho et al. | |
| 2015/0366062 A1* | 12/2015 | Noda ................ | H01L 23/49827 361/803 |
| 2016/0353568 A1 | 12/2016 | Lee et al. | |
| 2017/0019989 A1* | 1/2017 | Lee ........................ | H05K 3/007 |

FOREIGN PATENT DOCUMENTS

| | | |
|---|---|---|
| JP | 2015-195308 A | 11/2015 |
| KR | 10-2015-0062080 A | 6/2015 |
| KR | 10-2016-0140184 A | 12/2016 |

* cited by examiner

*Primary Examiner* — Timothy J Thompson
*Assistant Examiner* — Michael F McAllister
(74) *Attorney, Agent, or Firm* — Morgan, Lewis & Bockius LLP

(57) ABSTRACT

A printed circuit board includes a first insulating layer, a first pattern buried in a surface of the first insulating layer, the first pattern having a surface exposed from the surface of the first insulating layer, and a metal post disposed on the exposed surface of the first pattern. The metal post includes a first metal layer and a second metal layer. The first metal layer and the second metal layer include different metals.

20 Claims, 7 Drawing Sheets

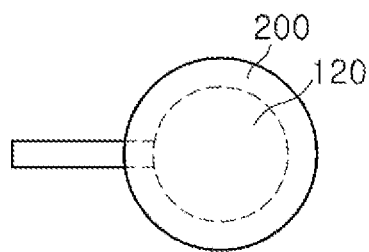
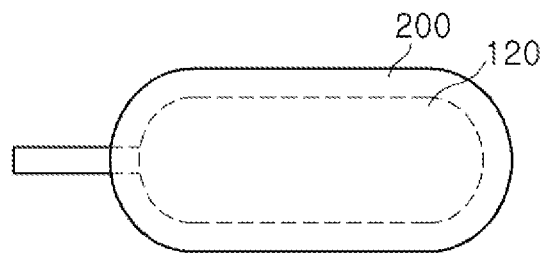
FIG. 5A  FIG. 5B
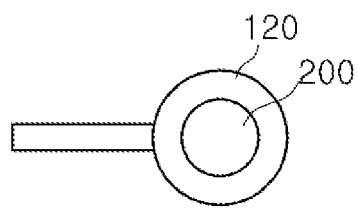
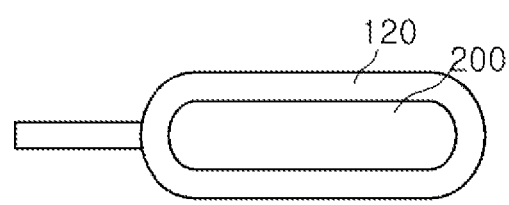
FIG. 5C  FIG. 5D
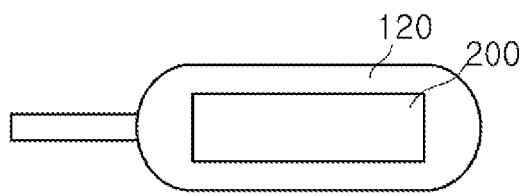
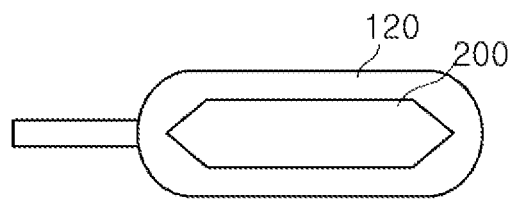
FIG. 5E  FIG. 5F

PRINTED CIRCUIT BOARD INCLUDING AN INSULATING LAYER AND A METAL POST

CROSS-REFERENCE TO RELATED APPLICATION(S)

This application claims benefit of priority to Korean Patent Application No. 10-2022-0099856 filed on Aug. 10, 2022 in the Korean Intellectual Property Office, the disclosure of which is incorporated herein by reference in its entirety.

TECHNICAL FIELD

The present disclosure relates to a printed circuit board.

In order to address the recent trend for reductions in the weight and size of mobile devices, the need to implement a reduction in weight, thickness, and size of printed circuit boards mounted thereon has been gradually increasing. In response to the technical demands for such mobile devices, research has continued to reduce the thickness of a board on which various components are mounted and to improve reliability when the components are connected to the board.

SUMMARY

An aspect of the present disclosure provides a printed circuit board capable of increasing bonding force when electronic components are mounted thereon.

Another aspect of the present disclosure provides a method for manufacturing a printed circuit board capable of improving reliability.

Another aspect of the present disclosure provides a printed circuit board capable of reducing manufacturing costs.

According to an aspect of the present disclosure, there is provided a printed circuit board including a first insulating layer, a first pattern buried in a surface of the first insulating layer, the first pattern having a first surface that is not covered by the first insulating layer, and a metal post disposed on the first surface of the first pattern. The metal post may include a first metal layer disposed on the first surface of the first pattern and a second metal layer disposed on a surface of the first metal layer. The first metal layer and the second metal layer may include different metals.

According to another aspect of the present disclosure, there is provided a printed circuit board including a first insulating layer, a first pattern buried in a surface of the first insulating layer, the first pattern having a first surface that is not covered by the first insulating layer, and a metal post disposed on the first surface of the first pattern. The metal post may include a first metal layer disposed on the surface of the first pattern and a second metal layer disposed on a surface of the first metal layer. The first metal layer and the first pattern may include different metals.

According to example embodiments of the present disclosure, a printed circuit board may increase bonding force when electronic components are mounted thereon.

According to example embodiments of the present disclosure, a printed circuit board may have improved reliability.

According to example embodiments of the present disclosure, a printed circuit board may reduce manufacturing costs.

BRIEF DESCRIPTION OF DRAWINGS

The above and other aspects, features, and advantages of the present disclosure will be more clearly understood from the following detailed description, taken in conjunction with the accompanying drawings, in which:

FIGS. 5A to 5F are each a top view illustrating various shapes of a metal post of a printed circuit board.

DETAILED DESCRIPTION

Figure 1:
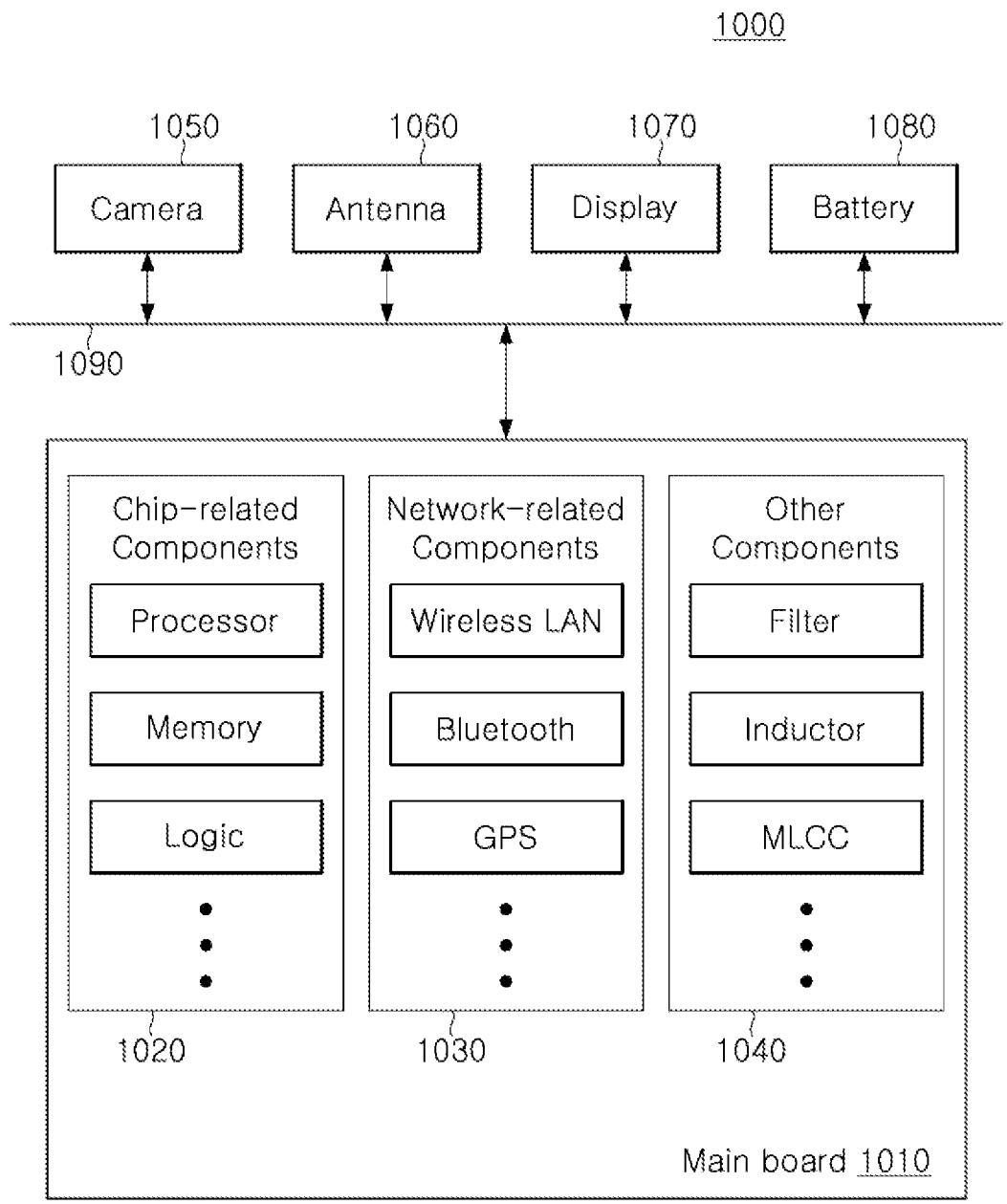
FIG. 1 is a schematic block diagram illustrating an example of an electronic device system.

Hereinafter, the present disclosure will be described with reference to the accompanying drawings. The shapes and sizes of elements in the drawings may be exaggerated or reduced for clearer description.

Electronic Device

FIG. 1 is a schematic block diagram illustrating an example of an electronic device system.

Referring to FIG. 1, an electronic device 1000 may accommodate a mainboard 1010. The mainboard 1010 may include chip-related components 1020, network-related components 1030, other components 1040, or the like, physically or electrically connected thereto. Such components may be connected to other components to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like, an application processor chip such as a central processor (for example, a central processing unit (CPU)), a graphics processor (for example, a graphics processing unit (GPU)), a digital signal processor, a cryptographic processor, a microprocessor, a microcontroller, or the like, and a logic chip such as an m analog-to-digital converter, an application-specific integrated circuit (ASIC), or the like, or the like. However, the chip-related components 1020 are not limited thereto, and may include other types of chip-related components. In addition, the chip-related components 1020 may be combined with each other. The chip-related components 1020 may be in the form of a package including the above-described chip or electronic component.

The network-related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless and wired protocols, designated after the above-described protocols. However, the network-related components 1030 are not limited thereto, and may also include a variety of other wireless or wired standards or protocols. In addition, the network-related components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip-related components 1020 or the network-related components 1030 described above.

Depending on a type of the electronic device 1000, the electronic device 1000 may include other components that may or may not be physically or electrically connected to the mainboard 1010. The other components may include, for example, a camera 1050, an antenna 1060, a display 1070, a battery 1080, and the like. However, the other components are limited thereto, and may be an audio codec, a video codec, a power amplifier, a compass, an accelerometer, a gyroscope, a speaker, a mass storage unit (for example, a hard disk drive), a compact disk (CD), a digital versatile disk (DVD), or the like. In addition, the other components may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
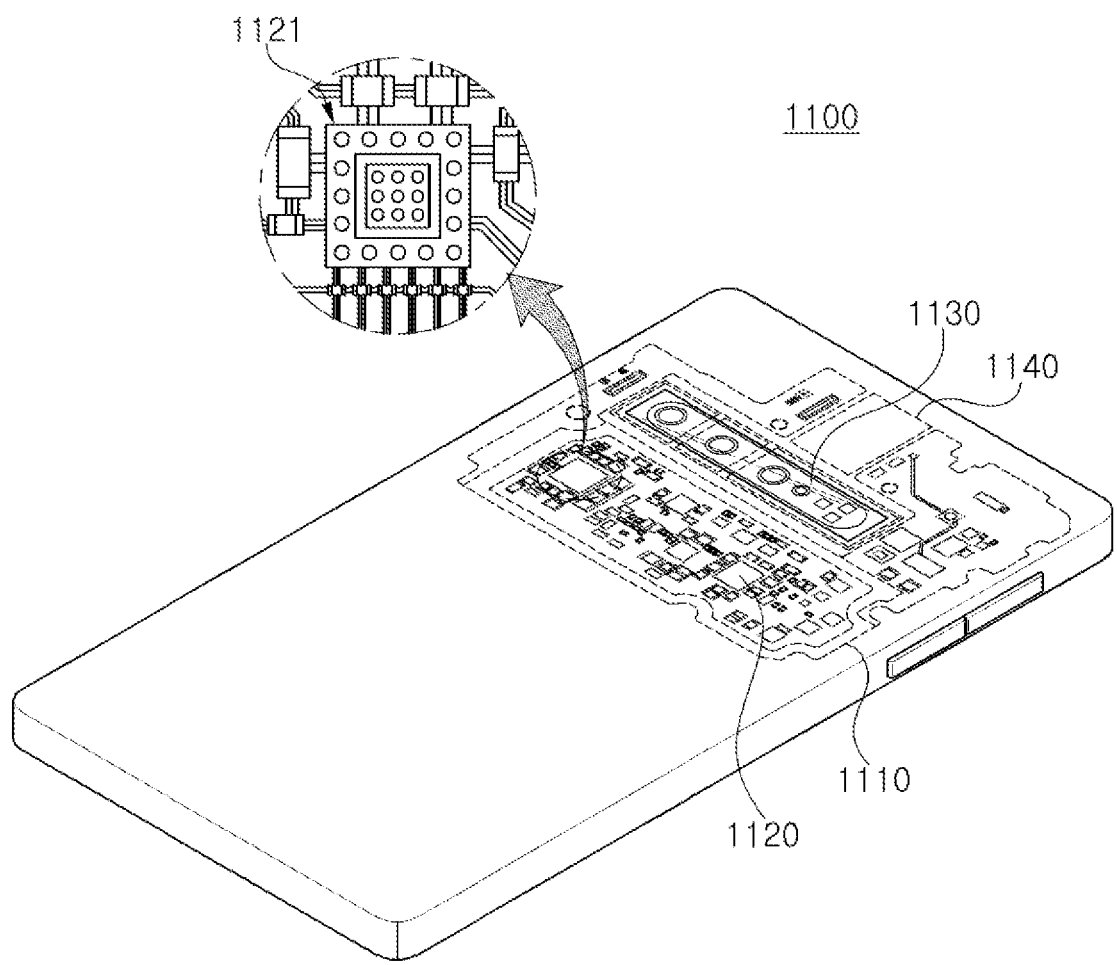
FIG. 2 is a schematic perspective view illustrating an example of an electronic device.

FIG. 2 is a schematic perspective view illustrating an example of an electronic device;

Referring to FIG. 2, an electronic device may be, for example, a smartphone 1100. The motherboard 1110 may be accommodated in the smartphone 1100, and various electronic components 1120 may be physically and/or electrically connected to the motherboard 1110. In addition, other electronic components that may or may not be physically and/or electrically connected to the motherboard 1110 may be accommodated therein, such as a camera module 1130 and/or a speaker 1140. A portion of the electronic components 1120 may be the above-described chip related components, for example, a component package 1121, but the present disclosure is not limited thereto. The component package 1121 may be in the form of a printed circuit board on which electronic components including active components and/or passive components are surface-mounted. The electronic device is not necessarily limited to the smartphone 1100, and may be other electronic devices as described above.

Printed Circuit Board

Figure 3:
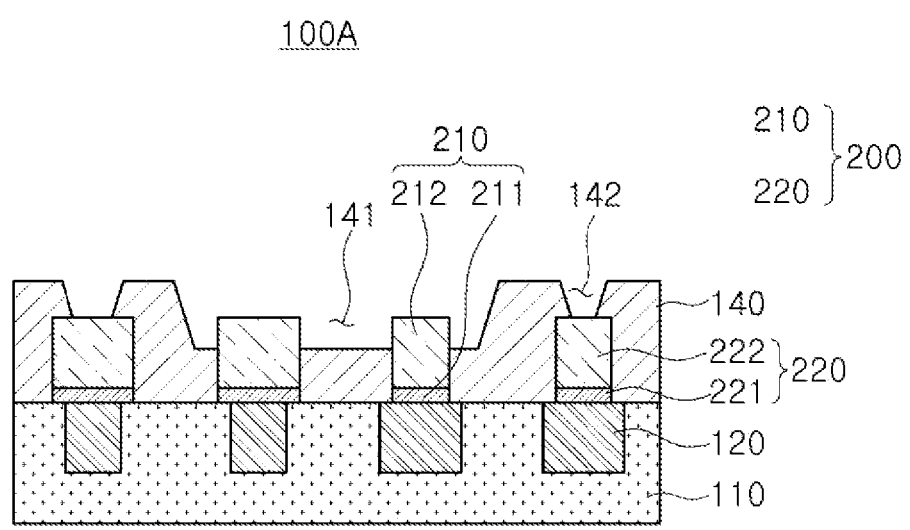
FIG. 3 is a schematic cross-sectional view illustrating an example of a printed circuit board.

FIG. 3 is a schematic cross-sectional view illustrating an example of a printed circuit board.

Referring to FIG. 3, a printed circuit board 100A according to an example may include a first insulating layer 110, and a first pattern 120 buried in a surface of the first insulating layer 110 and having a surface (first surface) exposed from the surface of the first insulating layer 110, and a metal post 200 disposed on the exposed surface of the first pattern 120. The metal post 200 may include a first metal layer 211 and a second metal layer 212. The first surface may not be covered by the first insulating layer 110.

The first insulating layer 110 may include an insulating material. The insulation material may include a thermosetting resin such as an epoxy resin, a thermoplastic resin such as a polyimide, or a material including an inorganic filler, organic filler, and/or glass fiber, glass cloth, and/or glass fabric, together with such resins. The insulating material may be a photosensitive material and/or a non-photosensitive material. For example, the insulating material may include a solder resist, an Ajinomoto build-up film (ABF), FR-4, bismaleimide triazine (BT), prepreg (PPG), resin coated copper (RCC), a copper clad laminate (CCL), and the like, but the insulating material is not limited thereto, and may include other polymeric materials.

The first pattern 120 may have a structure of being buried in the first insulating layer 110. That is, the first pattern 120 may be buried in a surface of the first insulating layer 110, and a surface of the first pattern 120 may be exposed from the surface of the first insulating layer 110, and the other surface the first pattern 120 may be covered by the first insulating layer 110 while being in contact therewith. However, the other surface the first pattern 120 may not necessarily need to be covered by the first insulating layer 110 while being in physical contact therewith, and may be buried in the first insulating layer 110 while being partially spaced apart therefrom. The first pattern 120 may have a structure of being buried in the first insulating layer 110 rather than a protruding pattern, such that one insulating layer among build-up layers may be reduced using an outermost layer among the build-up layers as an buried-type layer, thereby reducing an overall thickness of a printed circuit board.

In addition, the surface of the first pattern 120 may be substantially coplanar with the surface of the first insulating layer 110, but the present disclosure is not limited thereto. Two surfaces that are coplanar with each other is based on a concept that two surfaces form the same surface without a step, that is, are coplanar with each other. Being substantially coplanar is based on a concept including being approximately coplanar, and may include an error in a manufacturing process, for example. This is because, as will described below in connection with a manufacturing operation, the first pattern 120 is protected from being etched by a metal layer M formed on a carrier substrate C when an operation of removing the carrier substrate C is performed. The first pattern 120 may be protected from being etched, such that the first pattern 120 may be formed substantially flat without a dent, and the surface of the first pattern 120 may be coplanar with the surface of the first insulating layer 110. Being substantially flat is based on a concept including being approximately flat, and may include, for example, an error in a manufacturing process. The coplanarity and flatness may be observed using electron microscopy. Other methods and/or tools appreciated by one of ordinary skill in the art, even if not described in the present disclosure, may also be used.

The first pattern 120 may include a metal material. The metal material may include copper (Cu), aluminum (Al), silver (Ag), tin (Sn), gold (Au), nickel (Ni), lead (Pb), titanium (Ti), and/or alloys thereof, preferably copper (Cu), but the metal material is not limited thereto. The first pattern 120 may be a general circuit pattern, and may perform various functions according to a design for mounting a component thereon. A first pad may be formed by one of a semi-additive process (SAP), a modified semi-additive process (MSAP), and a subtractive process, but the present disclosure is not limited thereto.

The first pattern 120 may be formed as a plurality of patterns. The plurality of patterns may be simultaneously formed in an operation of forming the first pattern 120, but the present disclosure is not limited thereto. The plurality of patterns may be formed in a stepwise manner, and may have the above-described characteristics of the first pattern 120. In addition, the first pattern 120 may transmit and receive electrical signals to and from different patterns, or may transmit and receive electrical signals to patterns further disposed on different layers. The first pattern 120 may be electrically shorted from other patterns to perform a function.

A metal post 200 may be disposed on the surface of the first pattern 120. The metal post 200 may include first metal layers 211 and 221 disposed on the surface of the first pattern 120 and second metal layers 212 and 222 disposed on surfaces of the first metal layers 211 and 221.

Although not illustrated in FIG. 3, an electronic component may be mounted on the surface of the first pattern 120, and the electronic component may be a well-known active component or passive component, but the electronic component is not limited thereto. A printed circuit board including a redistribution layer may be mounted, and may be connected to an interposer connecting substrates to each other or connecting a substrate and a chip to each other. The electronic component may include a connection electrode for connection to a printed circuit board, and the connection electrode may be electrically connected to the first pattern 120 through the metal post 200. As a means for connection between the electronic component and the printed circuit board, a means such as a solder ball may be used, but the connection means is not limited thereto, and any means capable of electrically connecting the electronic component and the printed circuit board to each other may be used.

The metal post 200 may perform a function of improving adhesion with the connection means and reliability of signal transmission when the electronic component is mounted on the first pattern 120, and may perform a function of facilitating connection of the electronic component or the like by complementing a thickness of a solder resist, but the present disclosure is not limited thereto.

The first metal layers 211 and 221 may be disposed on the surface of the first pattern 120. A width of each of the first metal layers 211 and 221 may be formed to be wider or narrower than a width of the first pattern 120, but the present disclosure is not limited thereto. When the width of each of the first metal layers 211 and 221 is wider than the width of the first pattern 120, the first metal layers 211 and 221 may cover the surface of the first pattern 120. When the width of each of the first metal layers 211 and 221 is narrower than the width of the first pattern 120, the surface of the first pattern 120 may be exposed to the outside. A width of a component is based on a concept including an approximate width, and may be interpreted as having a meaning of a horizontally crossed distance of a component, but may include an error in measurement or an error in a manufacturing process. For example, the width of each of the first metal layers 211 and 221 may refer to a maximum distance between edges having a longer length on the surface of the first metal layer, but the present disclosure is not limited thereto. The width of each of the first metal layers 211 and 221 may be a distance measured from a surface of a first metal layer or a distance measured from the other surface of the first metal layer. That is, when a cross-sectional area of each of the first metal layers 211 and 221 have an oval shape or a polygonal shape such as a quadrangle, a maximum distance between longer edges on a surface thereof may be interpreted as a width. When the first metal layers 211 and 221 have a circular cross-sectional area, the width thereof may be interpreted as having a meaning the same as that of the diameter. The width of each of the first metal layers 211 and 221 wider than the width of the first pattern 120 may be interpreted that the cross-sectional area of each of the first metal layers 211 and 221 is greater than a cross-sectional area of the first pattern 120, when compared to each other in terms of a cross-sectional area of a contact surface of the first metal layers 211 and 221, and the first pattern 120. The width of each of the first metal layers 211 and 221 and the width of the first pattern 120 may be measured by electron microscopy. Other methods and/or tools appreciated by one of ordinary skill in the art, even if not described in the present disclosure, may also be used. As the first metal layers 211 and 221 are disposed on the first pattern 120, the printed circuit board 100A according to an example may not have a pattern and/or a pad protruding from the surface of the first insulating layer 110. That is, the surface of the first pattern 120 may be coplanar with the first insulating layer 110, and an interface between the first pattern 120 and the first metal layers 211 and 221 may be coplanar with the surface of first insulating layer 110.

The first metal layers 211 and 221 may be formed of a metal. For example, the first metal layers 211 and 221 may include one of nickel (Ni) and titanium (Ti), and may be formed of an alloy further including another metal, together with the above-described metals. For example, invar, an alloy including nickel (Ni) and iron (Fe), is an example, and is not limited to the above-described example, and may include various other metals. The first metal layers 211 and 221 may be formed of a metal different from a metal of the first pattern 120. This is because, as will be described below in connection with a manufacturing operation, the first metal layers 211 and 221 are formed by removing a portion of the metal layer M after a carrier substrate and a printed circuit board are separated from each other. As described above, the first pattern 120 may preferably include copper (Cu).

The first metal layers 211 and 221 may have various shapes. When viewed from above, the first metal layers 211 and 221 may have a circular, oval, or polygonal shape. The polygonal shape may be mainly a shape such as a rectangular shape, a hexagonal shape, or the like, but the polygonal shape is not limited thereto, and may be any shape of a figure having an angle, such as an acute angle, an obtuse angle, or a right angle.

The second metal layers 212 and 222 may be formed on surfaces of the first metal layers 211 and 221, respectively.

A metal material may be used as a material of the second metal layers 212 and 222. As the metal material, copper (Cu), aluminum (Al), silver (Ag), tin (Sn), gold (Au), nickel (Ni), lead (Pb), titanium (Ti), or alloys thereof may be used. The second metal layers 212 and 222 may include a metal different from that of the first metal layers 211 and 221. The second metal layers 212 and 222 may be formed of a metal the same as that of the first pattern 120, but the material of the second metal layers 212 and 222 is not limited thereto. The second metal layers 212 and 222 may include copper (Cu).

The second metal layers 212 and 222 may be formed through a plating process, for example, a process such additive plating (AP), semi-additive plating (SAP), modified semi-additive plating (MSAP), tenting (TT), or the like, but the present disclosure is not limited thereto.

Widths of the second metal layers 212 and 222 may be respectively the same as widths of the first metal layers 211 and 221, but the present disclosure is not limited thereto. As will be described below in connection with a manufacturing operation, the first metal layers 211 and 221 may be formed after the second metal layers 212 and 222 are formed, and thus the widths of the second metal layers 212 and 222 may be preferably formed to be the same as the widths of the first metal layers 211 and 221. In addition, shapes of the second metal layers 212 and 222 may be the same as those of the first metal layers 211 and 221. The width of each of the second metal layers 212 and 222 may be measured by electron microscopy. Other methods and/or tools appreciated by one of ordinary skill in the art, even if not described in the present disclosure, may also be used.

Thicknesses of the first metal layers 211 and 221 may be respectively less than thicknesses of the second metal layers 212 and 222. A thickness of a component is based on a concept including an approximate thickness, and may be interpreted as having a meaning of a distance between an upper surface and a lower surface of a component, but may include an error in measurement or an error in a manufacturing process. For example, a thickness of each of the first metal layers 211 and 221 may refer to a distance between a surface and the other surface of a first metal layer, and a thickness of each of the second metal layers 212 and 222 may refer to a distance between a surface and the other surface of a second metal layer. Here, the thickness may refer to an average thickness. The thickness may be measured by photographing a cross-section of a printed circuit board with a scanning electron microscope, and the average thickness may be an average value of thicknesses measured at five arbitrary points. Other methods and/or tools appreciated by one of ordinary skill in the art, even if not described in the present disclosure, may also be used.

A cost of forming the metal of the second metal layers 212 and 222 may be different from a cost of forming the metal of the first metal layers 211 and 221, and thus the first metal layers 211 and 221 may be formed to be thinner than the second metal layers 212 and 222, thereby reducing a cost of the printed circuit board.

The first pattern 120 may be formed as a plurality of patterns, and thus the metal post 200 may include a plurality of metal posts, and may include the first metal post 210 and the second metal post 220. The first metal post 210 and the second metal post 220 may include first metal layers 211 and 221 and second metal layers 212 and 222, respectively. In some embodiments, the metal post may further include a third metal post having a width that is broader than a width of the first metal post.

A width of the metal post 200 may not be collectively determined, and posts having various sizes of widths may be disposed. The metal post 200 may not be disposed on surfaces of all of the plurality of patterns, and there may be a pattern in which the metal post 200 is not disposed. The width of the metal post 200 may be measured in the same manner as the widths of the first metal layers 211 and 221, as described above. The metal post 200 of the printed circuit board 100A according to an example may be formed to have a substantially constant width. The substantially constant width is based on a concept including an approximate width, and may include, for example, an error in a manufacturing process.

A solder resist layer 140 may be further disposed on the surface of the first insulating layer 110. The solder resist layer 140 may protect the printed circuit board 100A from the outside. The solder resist layer 140 may include a thermosetting resin and an inorganic filler dispersed in the thermosetting resin, but may not include a glass fiber. An insulating resin may be a photosensitive insulating resin, and a filler may be an inorganic filler and/or an organic filler, but the present disclosure is not limited thereto. However, a material of the solder resist layer 140 is not limited thereto, and other polymer materials may be used, as necessary. In some embodiments, at least a portion of side surface of the third metal post may be covered by the solder resist layer.

The solder resist layer 140 may include the first opening 141 and the second opening 142, and the second metal layers 212 and 222 may be exposed to the outside through an opening. In some cases, the first metal layers 211 and 221 may be exposed, together with the second metal layers 212 and 222. A width of the opening is not limited, and the first opening 141 and the second opening 142 may include a plurality of openings. One opening may not expose one metal post 200, but a plurality of metal posts 200 may be exposed to the outside through one opening.

A depth of the first opening 141 may be greater than a depth of the second opening 142. The depth is based on a concept including an approximate depth, for example, may include an error in a manufacturing process or a measurement process. The depths of the openings 141 and 142 may refer to a depth from an upper surface of the solder resist layer 140 to a bottom surface of an opening. When at least a portion of the bottom surface of the opening includes the solder resist layer 140, the depth of openings may refer to a maximum depth from a region of the upper surface of the solder resist layer 140 in which a wall surface of the opening starts to a surface of a solder resist layer included in the bottom surface of the opening. When the bottom surface of the opening includes a metal post, the depth of openings may refer to a maximum depth from the region of the upper surface of the solder resist layer 140 in which the wall surface of the opening starts to an exposed surface of the metal post. The depth of each of the openings 141 and 142 may be measured by electron microscopy. Other methods and/or tools appreciated by one of ordinary skill in the art, even if not described in the present disclosure, may also be used. The first opening 141 may expose the first metal post 210 to the outside, and the first opening 141 may expose a surface of the second metal layer 212, together with at least a portion of a side surface of the second metal layer 212 of the first metal post 210. A connection member such as an electronic component or the like mounted through the first metal post 210 may cover at least a portion of the side surface of the second metal layer 212, but the present disclosure is not limited thereto, and may be disposed on an upper surface of the second metal layer 212. An electronic component or a die may be mainly mounted on the first metal post 210, but the present disclosure is not limited thereto.

The second opening 142 may expose the second metal post 220 to the outside, and the second opening 142 may expose at least a portion of a surface of the second metal layer 222 of the second metal post 220. A side surface of the second metal layer 222 of the second metal post 220 may not be exposed through the second opening 142, and the side surface of the second metal layer 222 may be covered by the solder resist layer 140. Only the surface of the second metal layer 222 of the second metal post 220 may be exposed through the second opening 142, and thus an electronic component or the like mounted through the second metal post 220 may mainly correspond to an interposer, but the present disclosure is not limited thereto. At least a portion of the surface of the second metal layer 222 of the second metal post 220 may be exposed, and thus a connection member or the like may be formed on the surface of the second metal layer 222.

The printed circuit board 100A according to an example is not limited to have the components illustrated in the drawings, and may further include a circuit pattern further formed on the other surface of the first insulating layer 110. In particular, in the present disclosure, a printed circuit board may be configured as a single layer, but the printed circuit board is merely exemplary, and may further include general components of the printed circuit board, such as a different insulating layer, a different circuit pattern, a through-via, a cavity, and the like. That is, the printed circuit board may further include a component that is usable by a person skilled in the art.

Figure 4:
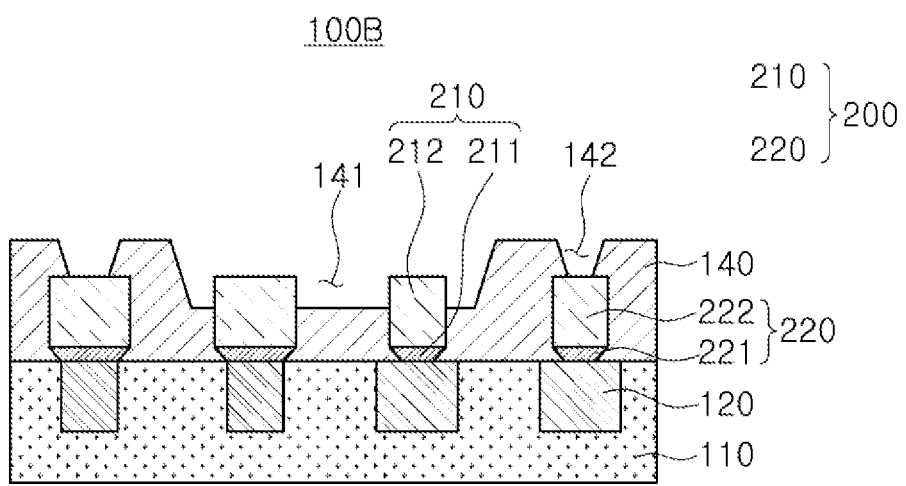
FIG. 4 is a schematic cross-sectional view illustrating another example of a printed circuit board.

FIG. 4 is a schematic cross-sectional view illustrating another example of a printed circuit board.

Referring to FIG. 4, in a printed circuit board 100B according to another example, a width of each of surfaces of the first metal layers 211 and 221 may be formed to be wider than a width of each of the other surfaces of the first metal layers 211 and 221 opposing the surfaces.

The other surfaces of the first metal layers 211 and 221 correspond to surfaces in contact with a surface of the first pattern 120, and the width of each of the other surfaces of the first metal layers 211 and 221 may be substantially the same as a width of the surface of the first pattern 120, but the present disclosure is not limited thereto, and may be narrower than the width of the surface of the first pattern 120. In the present disclosure, "substantially the same" is based on a concept including "approximately the same," and may include, for example, a process error or a positional deviation occurring in a manufacturing process, an error in measurement, and the like. As the width of each of the other surfaces of the first metal layers 211 and 221 is formed to be narrower than the width of each of the surfaces of the first metal layers 211 and 221, a width of each of the first metal layers 211 and 221 on a contact surface of the first pattern 120 and the first metal layers 211 and 221 may be narrower than the width of each of the surfaces of the first pattern 120, thereby improving reliability, such as prevention of electrical signal loss at a boundary between the first metal layers 211 and 221 having a relatively high resistivity value and the first pattern 120 having a relatively low resistivity value. The width of each of the surfaces of the first metal layers 211 and 221 and the width of each of the other surfaces of the first metal layers 211 and 221 may be measured by electron microscopy. Other methods and/or tools appreciated by one of ordinary skill in the art, even if not described in the present disclosure, may also be used.

As will be described below in connection with a manufacturing operation, the widths of the other surfaces of the first metal layers 211 and 221 may be adjusted in an operation of forming shapes of the first metal layers 211 and 221 after shapes of the second metal layers 212 and 222 are manufactured. The first metal layers 211 and 221 may be formed of a metal different from those of the second metal layers 212 and 222 and the first pattern 120, and thus the second metal layers 212 and 222 or the first pattern 120 may not change even when an etching operation is performed to adjust the widths of the first metal layers 211 and 221.

Among components other than the first metal layers 211 and 221, a component the same as the printed circuit board 100A according to an example may be applied to the printed circuit board 100B according to another example, and thus a repeated description thereof will be omitted.

FIGS. 5A to 5F are each a top view illustrating various shapes of a metal post of a printed circuit board.

Referring to FIGS. 5A to 5F, when viewed from above, the first pattern 120 may have a circular or oval shape, and the metal post 200 may have a circular, oval, or polygonal shape. The first metal layers 211 and 221 and the second metal layers 212 and 222 may be formed of different metals. As will be described below in connection with a manufacturing operation, in an operation of forming the second metal layers 212 and 222, the first metal layers 211 and 221 may be in the form of the metal layer M, and thus the metal layer M may serve as an etching barrier of the first pattern 120. The first pattern 120 may be protected from being etched, and thus the shapes of the second metal layers 212 and 222 may be modified in various manners, and the widths of the second metal layers 212 and 222 may be modified in various manners.

FIGS. 5A and 5B illustrate a case in which a width of the metal post 200 is wider than a width of the first pattern 120. When viewed from above, the first pattern 120 covered by the metal post 200 may not be visible. In FIGS. 5A and 5B, only a case in which the metal post 200 is formed to have a circular shape and an oval shape is illustrated, but the present disclosure is not limited thereto.

FIGS. 5C to 5D illustrate a case in which a width of the metal post 200 is narrower than a width of the first pattern 120. When viewed from above, the first pattern 120 and the metal post 200 may be exposed.

FIGS. 5A to 5F illustrates the first pattern 120 having only a circular or oval shape, but the present disclosure is not limited thereto. In addition, although the first insulating layer 110 and the solder resist layer 140 are not illustrated in FIGS. 5A to 5F, as described above, the first pattern 120 may be buried in the first insulating layer 110, such that a surface of the first pattern 120 may be exposed from a surface of the first insulating layer 110, and the solder resist layer 140 may be disposed on the surface of the first insulating layer 110, such that the first pattern 120 may be buried.

Even in a printed circuit board according to another example, the metal post 200 may have various shapes, as illustrated in FIGS. 5A to 5F.

Method of Manufacturing Printed Circuit Board

Figure 6:
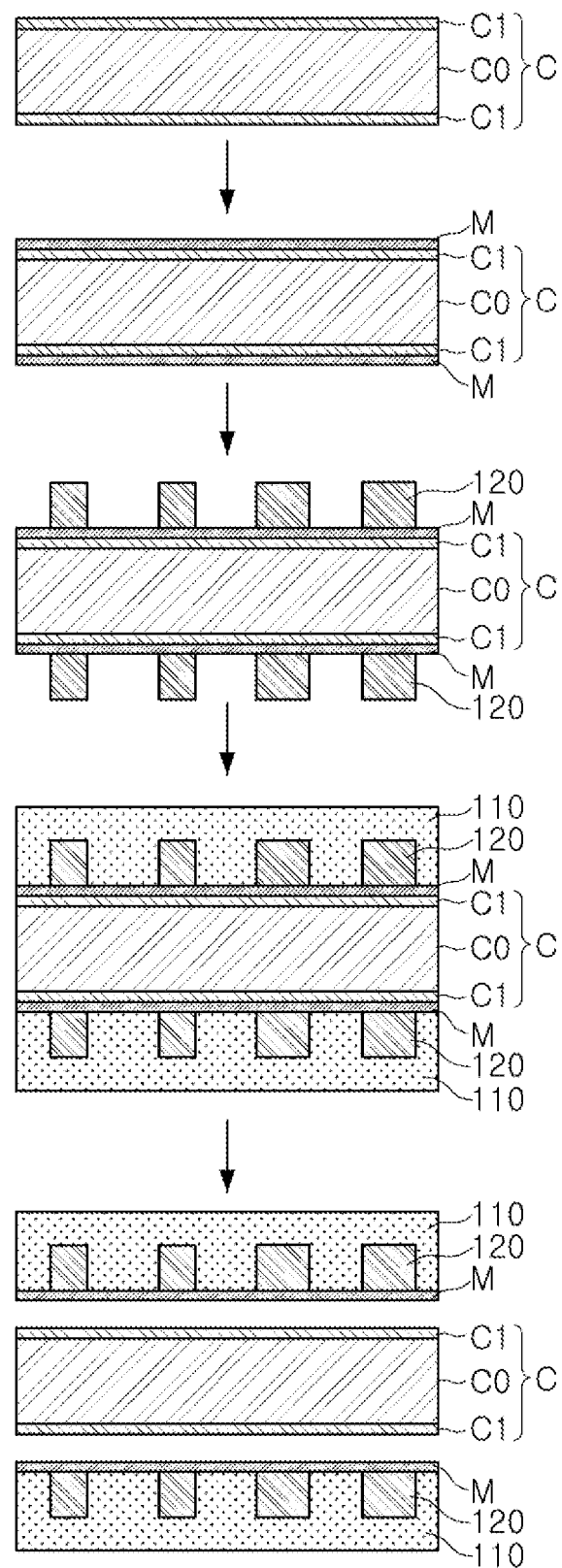
FIGS. 6 and 7 are schematic process diagrams illustrating an example of manufacturing the printed circuit board of FIG. 3.
Figure 7:
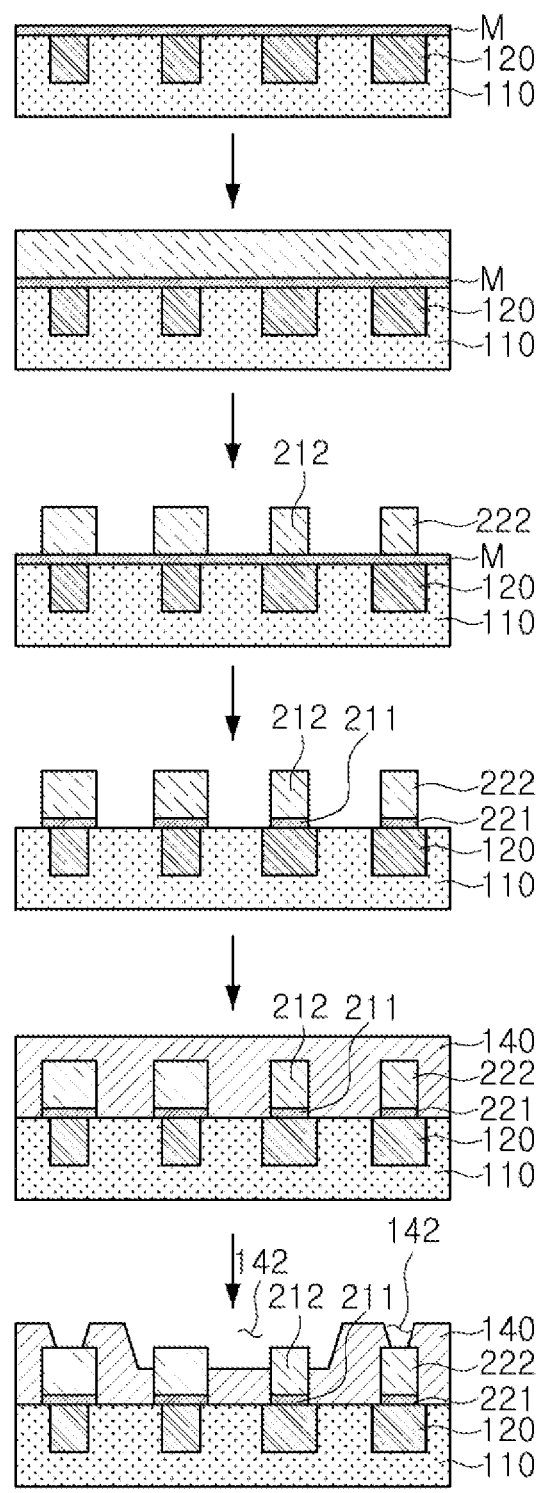

FIGS. 6 and 7 are schematic process diagrams illustrating an example of manufacturing the printed circuit board of FIG. 3.

Referring to FIG. 6, a carrier substrate C including a core C0 and a carrier seed layer C1 formed on one or opposite surfaces thereof may be prepared. The core C0 that is used to support an insulating layer and/or a circuit layer when the insulating layer and/or the circuit layer are formed, may be formed of an insulating material or a metal material. The carrier seed layer C1 may be formed of copper, but the present disclosure is not limited thereto. The above-described carrier substrate C is an exemplary case, and the carrier substrate could be used by a person skilled in the art. Any carrier substrate that is usable as a support substrate and is detachable or removable later may be used without any particular limitation in the present disclosure.

Thereafter, a metal layer (M) may be formed on a surface of the carrier seed layer C1. The metal layer M may be the first metal layers 211 and 221 in an operation to be described below. The metal layer M may be a component the same as the first metal layers 211 and 221, and thus may be the same as that described in the example of the printed circuit board. The metal layer M may correspond to a layer before processing a shape thereof, and thus may be formed on an entire surface of the carrier substrate C.

Thereafter, an operation of forming the first pattern 120 may be performed. The first pattern 120 may be formed through any process as long as a known pad or conductor pattern is formable. That is, the first pattern 120 may be formed through one of a semi additive process (SAP), a modified semi additive process (MSAP), or a subtractive process. In this case, the carrier seed layer C1 may serve as a seed layer for forming the first pattern 120.

Thereafter, the first insulating layer 110 may be formed to bury the first pattern 120. The first insulating layer 110 may be the same as that described in the example of the printed circuit board, and the first pattern 120 may be buried, such that a surface of the first pattern 120 may also be exposed from a surface of the first insulating layer 110.

As described in connection with the printed circuit board 100A according to an example, the printed circuit board 100A is not limited to the components illustrated in FIGS. 3 and 6, and the other surface of the first insulating layer 110 may further include a circuit pattern, and the printed circuit board 100A may be a printed circuit board including multiple layers. In the case of further including general components of the printed circuit board such as a different insulating layer, a different circuit pattern, a through-via, a cavity, and the like, an operation of forming the above-described components may be further included after an operation of forming a first insulating layer.

Thereafter, the carrier substrate C may be removed. Through removal of the carrier substrate C, the core C0 and the carrier seed layer C1 may also be removed at once, but the present disclosure is not limited thereto. After the core C0 is first removed, an operation of removing the carrier seed layer C1 may be performed. The carrier seed layer C1 may be removed by etching. In this case, the carrier seed layer C1 may be formed of a metal different from that of the metal layer M, and thus the metal layer M may not be etched in an operation of etching the carrier seed layer C1.

Referring to FIG. 7, operations after removing the carrier substrate C are illustrated. For ease, a printed circuit board formed on a lower surface of the carrier substrate C will be described, but the present disclosure is not limited thereto.

The second metal layers 212 and 222 may be formed on a surface of the metal layer M. It is described that shapes of the second metal layers 212 and 222 are formed after the second metal layers 212 and 222 are formed on the entire surface of the metal layer M, but the present disclosure is not limited thereto. The second metal layers 212 and 222 may be formed only in desired regions using a plating resist. That is, the second metal layers 212 and 222 may be formed through a process such AP, SAP, MSAP, TT, or the like. The second metal layers 212 and 222 may have various shapes, such as a circular shape, an oval shape, and a polygonal shape, as described in the example of the above-described printed circuit board.

Thereafter, the first metal layers 211 and 221 may be formed. The first metal layers 211 and 221 may be formed by etching the metal layer M. In this case, the second metal layers 212 and 222 may be formed on the surface of the metal layer M on which the first metal layers 211 and 221 are formed, and thus the first metal layers 211 and 221 may be manufactured to have shapes as those of second metal layers 212 and 222.

In this case, the metal layer M may include a metal different from those of the first pattern 120 and the second metal layers 212 and 222, and thus the first pattern 120 and the second metal layers 212 and 222 may form the first metal layers 211 and 221 without being etched.

In the printed circuit board 100B according to another example, a width of each of the first metal layers 211 and 221 may be adjusted in an operation of forming the first metal layers 211 and 221. The first metal layers 211 and 221 may include a metal different from that of the first pattern 120 and the second metal layers 212 and 222, and thus an etching rate and a degree of etching may be adjusted without damaging the first pattern 120 and the second metal layers 212 and 222, thereby adjusting a width of each of surfaces of the first metal layers 211 and 221 to be wider than a width of each of the other surfaces of the first metal layers 211 and 221.

Thereafter, the solder resist layer 140 may be formed on a surface of the first insulating layer 110. The solder resist layer 140 may be formed not only on the surface of the first insulating layer 110 but also on the other surface of the first insulating layer 110. The solder resist layer 140 may be formed on the surface of the first insulating layer 110 to bury the first pattern 120 and the metal post 200.

Thereafter, an opening may be formed in the solder resist layer 140. The opening may be a plurality of openings, the first opening 141 and the second opening 142 may have different widths and different depths, and the first opening 141 may be formed to be deeper than the second opening 142. A relationship between the first opening 141 and the second opening 142 may be the same as that of the printed circuit board 100A according to an example.

The printed circuit board 100A according to an example may be formed through a series of processes, but a manufacturing process is not necessarily limited thereto.

In the present disclosure, a cross-sectional shape may refer to a cross-sectional shape of an object when the object is vertically cut, or a cross-sectional shape of the object when the object is viewed in a side-view. In addition, a shape on a plane may be a shape of the object when the object is horizontally cut, or a planar shape of the object when the object is viewed in a top-view or a bottom-view.

In the present disclosure, an upper side, an upper portion, the upper surface, or the like is used to refer to a direction toward a surface on which an electronic component is mountable based on a cross-section of a drawing for ease, and a lower side, a lower portion, a lower surface, or the like is used to refer to an opposite direction thereof. However, the above-described directions are defined for ease of description. Thus, it should be understood that the scope of the claims is not particularly limited by the above-described directions.

As used herein, the term "connected" may not only refer to "directly connected" but also include "indirectly connected" by means of an adhesive layer, or the like. The term "electrically connected" may include both of a case in which components are "physically connected" and a case in which components are "not physically connected." In addition, the terms "first," "second," and the like may be used to distinguish a component from another component, and may not limit a sequence and/or an importance, or others, in relation to the components. In some cases, a first component may be referred to as a second component, and similarly, a second component may be referred to as a first component without departing from the scope of the example embodiments.

As used herein, the term "an example embodiment" is provided to emphasize a particular feature, structure, or characteristic, and do not necessarily refer to the same example embodiment. In addition, the particular characteristics or features may be combined in any suitable manner in one or more example embodiments. For example, a context described in a specific example embodiment may be used in other example embodiments, even if it is not described in the other example embodiments, unless it is described contrary to or inconsistent with the context in the other example embodiments.

The terms used herein describe particular example embodiments only, and the present disclosure is not limited thereby. As used herein, singular forms "a," "an," and "the"

are intended to include the plural forms as well, unless the context clearly indicates otherwise.

While example embodiments have been shown and described above, it will be apparent to those skilled in the art that modifications and variations could be made without departing from the scope of the present disclosure as defined by the appended claims.

What is claimed is:

1. A printed circuit board comprising:
a first insulating layer;
a first pattern buried in a surface of the first insulating layer, the first pattern having a first surface that is not covered by the first insulating layer; and
a metal post disposed on the first surface of the first pattern,
wherein the metal post includes a first metal layer disposed on the first surface of the first pattern and a second metal layer disposed on a surface of the first metal layer, and
the first metal layer and the second metal layer include different metals.

2. The printed circuit board of claim 1, wherein
the first metal layer includes one of nickel (Ni), titanium (Ti), and invar, and
the second metal layer includes copper (Cu).

3. The printed circuit board of claim 1, wherein
the first surface of the first pattern is substantially flat, and
an interface between the first pattern and the metal post is substantially coplanar with the surface of the first insulating layer.

4. The printed circuit board of claim 1, wherein a width of the metal post is wider than a width of the first pattern.

5. The printed circuit board of claim 1, further comprising:
a solder resist layer disposed on the surface of the first insulating layer.

6. The printed circuit board of claim 5, wherein
the solder resist layer includes a first opening and a second opening, and
a depth of the first opening is greater than a depth of the second opening.

7. The printed circuit board of claim 6, wherein
the metal post includes a first metal post and a second metal post,
the first metal post has both at least a portion of a surface and a side surface exposed to the outside through the first opening, and
the second metal post has at least a portion of a surface exposed to the outside through the second opening.

8. The printed circuit board of claim 1, wherein a thickness of the first metal layer is less than a thickness of the second metal layer.

9. The printed circuit board of claim 1, wherein a cross-section of the metal post has one shape among a circular shape, an oval shape, and a polygonal shape.

10. The printed circuit board of claim 1, wherein a width of the surface of the first metal layer is wider than a width of the other surface of the first metal layer opposing the surface of the first metal layer.

11. The printed circuit board of claim 1, wherein a width of the other surface of the first metal layer is substantially the same as a width of the first pattern.

12. The printed circuit board of claim 1, wherein
the metal post includes a first metal post and a third metal post having a width that is broader than a width of the first metal post.

13. The printed circuit board of claim 12, further comprising:
a solder resist layer disposed on the surface of the first insulating layer.

14. The printed circuit board of claim 13, wherein
at least a portion of side surface of the third metal post is covered by the solder resist layer.

15. The printed circuit board of claim 12, wherein the first metal layer includes an alloy including at least one of nickel (Ni) and titanium (Ti).

16. A printed circuit board comprising:
a first insulating layer;
a first pattern buried in a surface of the first insulating layer, the first pattern having a first surface that is not covered by the first insulating layer; and
a metal post disposed on the first surface of the first pattern,
wherein the metal post includes a first metal layer disposed on the surface of the first pattern and a second metal layer disposed on a surface of the first metal layer, and
the first metal layer and the first pattern include different metals.

17. The printed circuit board of claim 16, wherein
the first metal layer includes one of nickel (Ni), titanium (Ti), and invar, and
the first pattern includes copper (Cu).

18. The printed circuit board of claim 16, wherein the first pattern and the second metal layer include the same metal.

19. The printed circuit board of claim 16, further comprising:
a solder resist layer disposed on the surface of the first insulating layer.

20. The printed circuit board of claim 19,
the metal post includes a first metal post and a second metal post,
at least a portion of a side surface of the first metal post is exposed to the outside through the solder resist layer, and
a side surface of the second metal post is covered by a portion of the solder resist layer.

* * * * *